United States Patent [19]

Simmons

[11] Patent Number: 4,868,628

[45] Date of Patent: Sep. 19, 1989

[54] CMOS RAM WITH MERGED BIPOLAR TRANSISTOR

[75] Inventor: George H. Simmons, Sunnyvale, Calif.

[73] Assignee: Signetics Corporation, Sunnyvale, Calif.

[21] Appl. No.: 643,580

[22] Filed: Aug. 22, 1984

[51] Int. Cl.[4] .............................................. H01L 27/02
[52] U.S. Cl. ....................................... 357/43; 365/177
[58] Field of Search .................... 357/43, 41; 365/174, 365/177, 182

[56] References Cited

U.S. PATENT DOCUMENTS

| | | | |
|---|---|---|---|
| 4,125,854 | 11/1978 | McKenney | 357/41 |
| 4,150,392 | 4/1979 | Nonaka . | |
| 4,150,392 | 4/1979 | Nonaka . | |
| 4,217,688 | 8/1980 | Ipri | 357/43 |
| 4,626,887 | 12/1986 | Schmitt-Landsiedel et al. | 357/43 |
| 4,661,831 | 4/1987 | Schmitt-Landsiedel et al. | 357/43 |

FOREIGN PATENT DOCUMENTS

| | | |
|---|---|---|
| 20113 | 12/1980 | European Pat. Off. . |
| 55-101190 | 8/1980 | Japan . |
| 56-101770 | 8/1981 | Japan . |

*Primary Examiner*—Andrew J. James
*Assistant Examiner*—Mark Prenty

[57] ABSTRACT

A CMOS, N-well, P-channel static RAM cell with merged bipolar transistors as its output drivers.

9 Claims, 1 Drawing Sheet

CMOS RAM WITH MERGED BIPOLAR TRANSISTOR

This is an invention in circuitry. More particularly, it involves a novel integrated circuit memory cell.

Complementary metal oxide semiconductor (CMOS) technology is typically employed to fabricate static random access memory (RAM) devices. Both N-channel and P-channel memory cells have been designed. In the past, however, P-channel cells have for the most part been considered too slow for practical purposes.

It is an object of this invention to provide a CMOS N-well, P-channel static RAM cell that is faster than previous P-channel cells.

One of the features of the invention is the provision of merged NPN bipolar transistors for each cell which enhance the operation of the cell.

One of the advantages of the invention is that the NPN bipolar transistors are fabricated during conventional source/drain diffusions. Furthermore, the NPN bipolar transistors are fabricated by diffusing an N region into an inherent P region of the cell and consequently does not increase the size of the cell.

In accordance with the invention, there is provided an integrated circuit memory cell comprising a substrate of a first conductivity type semiconductor material. A region of a second conductivity type semiconductor material is located in the substrate and forms a well therein have a surface. Six regions of the first conductivity type semiconductor material are located in said well and form six pockets therein arranged in two sets of three pockets each. The first and the third pocket of each set is separated from the second along the surface of the well by sections of the well material comprising four in number. A thin oxide layer is located on the four sections of the well material forming insulator layers. Gate electrodes are located on the four insulator layers. The gate electrodes and the six pockets comprise four field effect transistors, namely data storage transistors and two drive transistors. One pocket in each set has a region of the second conductivity type semiconductor material located in it. Each such region in a pocket comprises the emitter of a bipolar transistor with the pocket it is located in comprising the base and the well comprising the collector of the associated bipolar transistor.

Other objects, features and advantages of the invention will be apparent from the following description and appended claims when considered in conjunction with the accompanying drawing in which:

Figure 1:
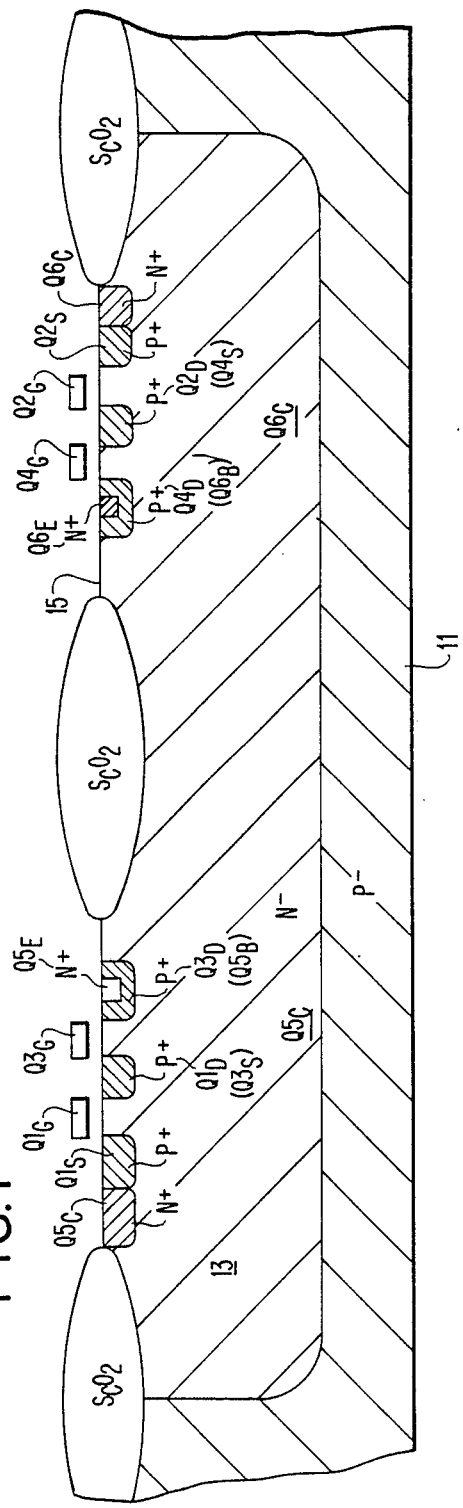
FIG. 1 is a cross-section of the memory cell of the invention.

Referring now to the drawing, there is shown in FIG. 1 a substrate 11 of a first conductivity or P-type semiconductor material. Located in the substrate is a region of a second conductivity or N-type semiconductor material forming a well 13 therein having a surface 15. Six regions of P-type semiconductor material are located in well 3. These are identified as $Q1_S$, $Q1_D$, $(Q3_S)$, $Q3_D$ $(Q5_B)$, $Q2_S$, $Q2_D$; $(Q4_S)$ and $Q4_D$ $(Q6_B)$. These regions form six pockets in the well and are arranged in two sets of three pockets each. The first pockets $Q1_S$ and $Q2_S$ and the third pockets $Q4_D$ $(Q6_B)$ and $Q3_D$ $(Q5_B)$ of each set are separated from the second pocket $Q1_D$ $(Q3_S)$ and $Q2_D$ $(Q4_S)$ along surface 15 of the well by sections of the well material comprising four in number. A thin oxide layer (not shown) is formed on the four separating sections of the well. These form insulator layers. Gate electrodes of a polysilicon material forming gates $Q1_G$, $Q2_G$, $Q3_G$ and $Q4_G$ are formed on the four insulator layers.

Diffused into the third pocket of each set is a region of N-type semiconductor material. These comprise the emitters $Q5_E$ and $Q6_E$ of two bipolar transistors of which pockets $Q5_B$ and $Q6_B$ form the bases and the N-type well forms the collectors $Q5_C$ and $Q6_C$.

Figure 2:
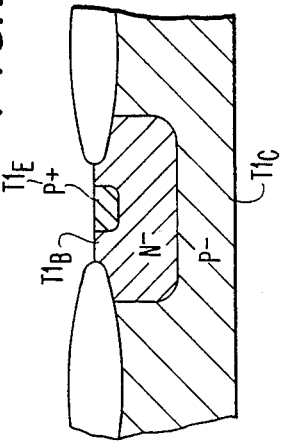
FIG. 2 is a cross-section of a PNP transistor used in an array of memory cells of the type shown in FIG. 1.
Figure 3:
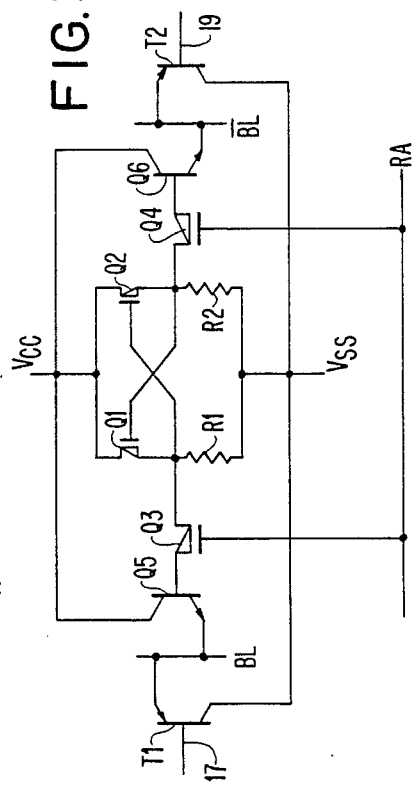
FIG. 3 is a circuit diagram of the cell shown in FIG. 1 together with two PNP transistors such as that shown in FIG. 2.

The six regions of P-type material in well 13 and the four gates comprise four field effect transistors Q1, Q2, Q3 and Q4 which are connected as shown in FIG. 3. Also shown in FIG. 3 are two bipolar PNP-type transistors T1 and T2. Each of these is formed on the substrate, as shown in FIG. 2 for transistor T1, by diffusing an N well $T1_B$ into the substrate to form the base of its associated transistor. The emitter of the associated transistor $T1_E$ is formed by the diffusion of a P-type material into the N well. The substrate comprises the collector $T1_C$ of the associated transistor. Resistors R1 and R2 (not shown in FIG. 1) may be formed as film devices on substrate 11 in any well known manner In operation if the cell shown in FIG. 3 is to be read, line RA is brought low to turn on transistors Q3 and Q4. Assume the cell to be in such condition that transistor Q1 is discharged and transistor Q2 is charged. When transistor Q3 turns on, transistor Q1 will not conduct and voltage $V_{CC}$ is not applied to the base of transistor Q5. As a result, that transistor remains in the off condition and line BL remains low. Since transistor Q2 is charged when transistor Q4 turns on voltage $V_{CC}$ is applied to the base of transistor Q6 through transistors Q2 and Q4 and transistor Q6 is turned on.

As a consequence, voltage $V_{CC}$ is applied to line $\overline{BL}$ to signify that transistor Q2 is charged.

To demonstrate a writing operation assume transistor Q1 is charged and transistor Q2 is discharged. The cell is written into in order to reverse its condition and cause transistor Q1 to be discharged and transistor Q2 to be charged. In order to do this, line RA again goes low to turn on transistors Q3 and Q4. In order to discharge transistor Q1, an appropriate voltage is applied along line 17 to the base of transistor T1 to cause it to turn on. This holds line BL at the low potential of $V_{SS}$ which pulls down the base of transistor Q5 and, through transistor Q3, the gate of transistor Q2 turning it on. When transistor Q2 goes on the gate of transistor Q1 goes high and transistor Q1 discharges. At the same time an appropriate voltage is applied along line 19 to the base of transistor T2 to maintain it in its off condition. The foregoing allows line $\overline{BL}$ to go high and signify that transistor Q2 become charged.

As those skilled in the art will appreciate, the arrangement described herein is for illustrative purposes and is not to be considered restrictive.

What is claimed is:

1. An integrated circuit memory cell comprising,
 a substrate of a first conductivity type semiconductor material;
 a region of a second conductivity type semiconductor material located in said substrate and forming a well therein having a surface;

six regions of said first conductivity type semiconductor material located in said well and forming six pockets therein arranged in two sets of three pockets each, the first and third pocket of each set being separated from the second along the surface of said well by sections of said well material comprising four in number;

a thin oxide layer located on said four sections of said well material forming insulator layers;

gate electrodes located on said four insulator layers;

said gate electrodes and said six pockets comprising four field effect transistors, namely two data storage transistors and two drive transistors;

one pocket in each set having a region of said second conductivity type semiconductor material located in it, each said region in a pocket comprising the emitter of a bipolar transistor with the pocket it is located in comprising the base and said well comprising the collector of said associated bipolar transistor.

2. An integrated circuit memory cell as in claim 1, wherein said first conductivity type semiconductor material is P-type material.

3. An integrated circuit memory cell as in claim 2, wherein said second type semiconductor material is N-type material.

4. An integrated circuit memory cell as in claim 3, wherein each said field effect transistor comprises source and drain regions and a gate electrode.

5. An integrated circuit memory cell as in claim 4, wherein the source regions of said data storage transistors are connected together and the drain region of each is connected to the gate electrode of the other.

6. An integrated circuit memory cell as in claim 5, wherein the source region of one of said drive transistors is connected to the gate electrode of one data storage transistor and the source region of the other drive transistor is connected to the gate electrode of the other data storage transistor.

7. An integrated circuit memory cell as in claim 6, wherein the drain region of one of said drive transistors is connected to the base of one of said bipolar transistors and the drain region of the other drive transistor is connected to the base of the other bipolar transistor.

8. An integrated circuit memory cell as in claim 7, wherein the collectors of said bipolar transistors are connected together and the emitters are the outputs of said memory cell.

9. An integrated circuit memory cell as in claim 8, including two PNP-type transistors, one for connecting the emitter of one of said bipolar transistors to a discharging voltage level and the other for connecting the emitter of the other bipolar transistor to said discharging potential.

* * * * *